United States Patent
Stepp et al.

(10) Patent No.: US 6,424,824 B1
(45) Date of Patent: Jul. 23, 2002

(54) APPARATUS FOR SETTING THE TUNING VOLTAGE OF TUNABLE RESONANT CIRCUITS

(75) Inventors: Richard Stepp; Hans-Eberhard Kröbel, both of München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/556,480

(22) Filed: Apr. 21, 2000

(30) Foreign Application Priority Data

Apr. 21, 1999 (DE) .......................... 199 18 057

(51) Int. Cl.[7] .............................. H04B 1/26
(52) U.S. Cl. ................ 455/197.3; 455/191.1; 455/178.1; 455/195.1; 455/340; 348/733
(58) Field of Search ............... 455/191.1, 193.2, 455/178.1, 180.3, 180.4, 195.1, 196.1, 197.3, 182.1, 192.1, 290, 260, 265, 340, 339; 348/725, 731, 733; 375/316, 327, 376

(56) References Cited

U.S. PATENT DOCUMENTS

| 4,748,683 | A | | 5/1988 | Sato |
|---|---|---|---|---|
| 4,862,516 | A | * | 8/1989 | Macnak et al. .......... 455/195.1 |
| 5,280,638 | A | * | 1/1994 | Porambo et al. ............ 455/340 |
| 5,678,211 | A | | 10/1997 | Badger |
| 5,748,046 | A | * | 5/1998 | Badger ........................ 455/260 |

FOREIGN PATENT DOCUMENTS

DE 40 11 839 C2 10/1991

OTHER PUBLICATIONS

Japanese Patent Application No. 63–28122 (Kimura et al.), dated Feb. 5, 1988.

* cited by examiner

*Primary Examiner*—Doris H. To
(74) *Attorney, Agent, or Firm*—Laurence A. Greenberg; Werner H. Stemer; Gregory L. Mayback (57) ABSTRACT

A setting apparatus for setting the tuning voltage of a tunable resonant circuit has an amplification device which amplifies an oscillator tuning voltage, output by a phase locked loop, nonlinearly to produce the tuning voltage. The gain of the amplification device can be set by a digital gain control signal. The signal resolution of the setting apparatus can be controlled in different ways as a function of the gain by using two differently driven digital/analog converters.

11 Claims, 9 Drawing Sheets

APPARATUS FOR SETTING THE TUNING VOLTAGE OF TUNABLE RESONANT CIRCUITS

BACKGROUND OF THE INVENTION

Field of the Invention

The invention relates to an apparatus for setting the tuning voltage in tunable resonant circuits, particularly in radio receivers.

In radio receivers, frequency-determining components of resonant circuits and other frequency-selective circuit configurations are tuned to a desired frequency or to a desired frequency range.

In integrated radio receivers, the resonant circuits are set by varying the bias voltage of variable-capacitance diodes or varactor diodes, whose capacitance decreases as the tuning voltage increases. In contrast to discrete components, such as tuning capacitors, such variable-capacitance diodes have the advantage that their Technology can be integrated on a semiconductor chip during manufacture, and they are therefore more economical to manufacture and, at the same time, miniaturization of the receiver is made easier.

In radio receivers, various programs can be received, amplified and reproduced on different frequency bands. Tuning circuits are used to set a desired frequency in order to ensure reception of a particular received signal transmitted on this frequency. To this end, an oscillator circuit is used to set an oscillator frequency, which is shifted by a fixed, predetermined intermediate frequency to produce the desired reception frequency, and is supplied to a mixer. The oscillator frequency and the prefiltered received signal, which is also supplied to the mixer, are used to produce the intermediate frequency signal. The mixer therefore has preliminary and intermediate resonant circuits connected upstream of it, which are used as frequency filters for the reception frequencies.

Tuning of the resonant circuits is not carried out manually, as was previously customary, but instead, in more recent receivers based on the prior art, is performed under electronic control.

Figure 1:
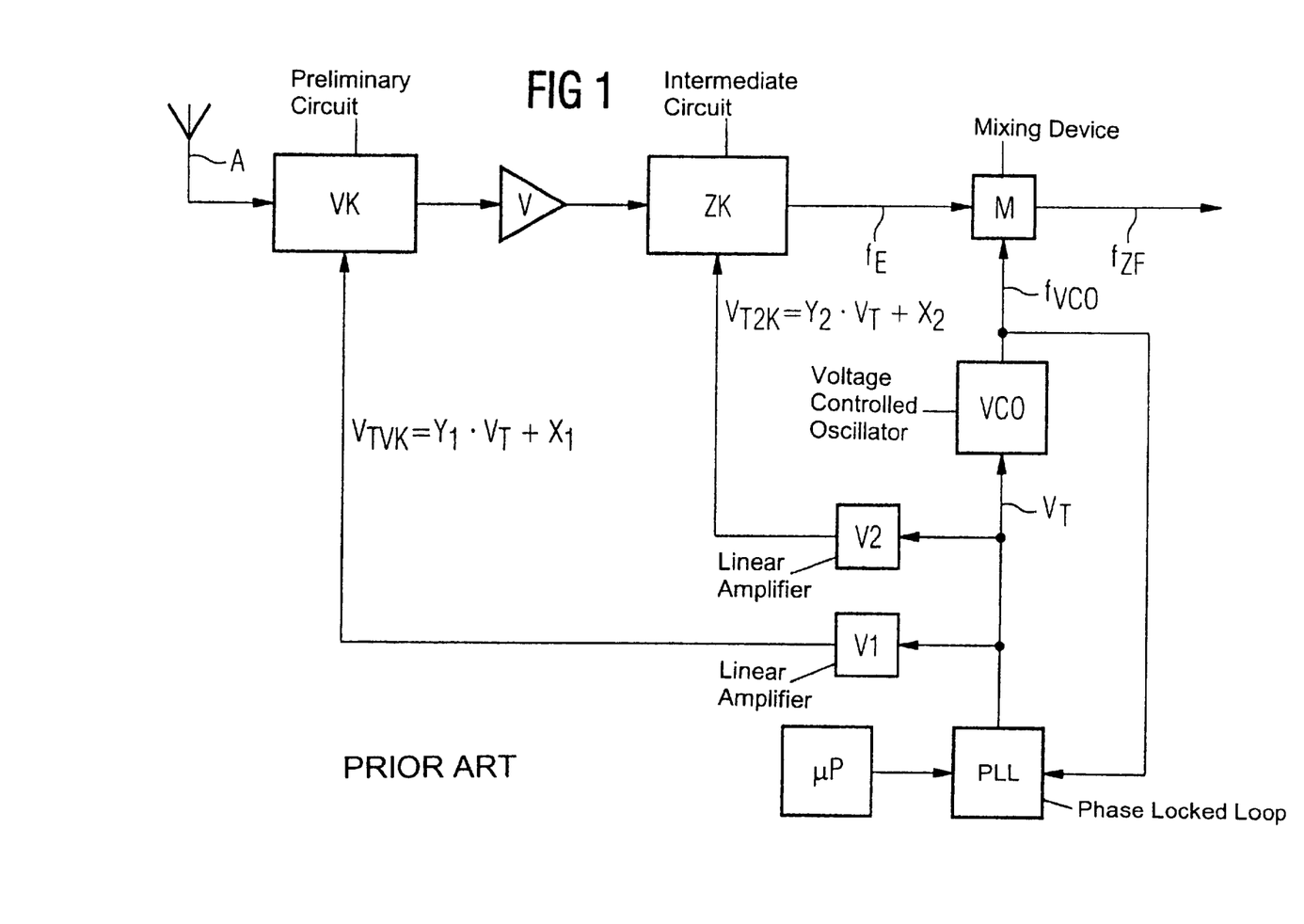
FIG. 1 is a block diagram of a conventional signal receiver.

A conventional receiver whose resonant circuits are tuned using an electronic control is shown in FIG. 1. For this purpose, the receiver has an antenna A which receives a radio signal and outputs it via a line to a first resonant circuit, the so-called preliminary circuit. The received signal is filtered by the preliminary circuit VK on the basis of the reception frequency and is then output to an amplifier V. The amplifier V amplifies the filtered received signal, which is again filtered on the basis of the reception frequency by a second, downstream resonant circuit, the so-called intermediate circuit ZK. The received signal filtered by the preliminary circuit VK and the intermediate circuit ZK is passed on to a mixing device M which filters the filtered signals onto a desired frequency range as a result of a voltage-controlled oscillator resonant circuit VCO setting an oscillator resonant frequency equivalent to the desired reception frequency. The desired intermediate frequency ZF at the output of the mixer M is 10.7 MHz, for example. The intermediate frequency ZF is given as the difference between the reception frequency $f_E$ and the oscillator resonant frequency $f_{VCO}$.

$$f_{ZF} = f_{VCO} - f_E$$

In a typical FM receiver, the reception frequency $f_E$ is in the range between 87.5 MHz and 108 MHz. Accordingly, the oscillator resonant frequency of the voltage-controlled oscillator VCO is between 98.2 MHz and 118.7 MHz, that is to say increased by the intermediate frequency $f_{ZF}$ of 10.7 MHz.

The oscillator resonant frequency $f_{VCO}$ is set through the use of an oscillator tuning voltage $V_T$ which can be regulated.

Figure 2:
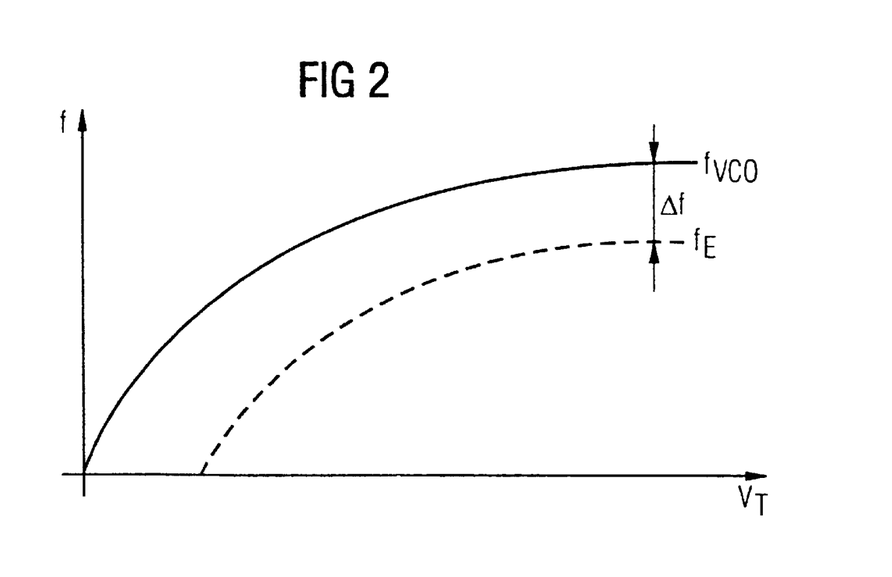
FIG. 2 is a graph illustrating an ideal frequency synchronism between the oscillator mixed frequency and the resonant circuit frequency.

The output signal from the voltage-controlled oscillator VCO is supplied via a feedback line to a phase locked loop PLL, which produces the oscillator tuning voltage $V_T$. As the oscillator tuning voltage $V_T$ rises, the oscillator resonant frequency $f_{VCO}$ increases, as can be seen from the graph in FIG. 2. The frequency spacing $\Delta f$ between the resonant frequency $f_{VCO}$ of the oscillator resonant circuit VCO and the reception frequency $f_E$ is ideally exactly the same size as the intermediate frequency $f_{ZF}$, for example 10.7 MHz. Ideally, the two curves $f_{VCO}$ and $f_E$ run parallel over the whole frequency range, i.e. the resonant circuits VK and ZK should ideally be set so that the frequency curve $f_E$ always runs parallel to the oscillator resonant frequency $f_{VCO}$, offset by the intermediate frequency $f_{ZF}$. However, theoretical considerations and component tolerances mean that such an ideal parallel curve shape, which is also called ideal synchronism, cannot be achieved.

In known receivers, the tuning circuits are iteratively adjusted in an attempt to approximate to ideal synchronism S by calculating linear coefficients for amplifying the oscillator tuning voltage $V_T$.

For this purpose, the oscillator tuning voltage $V_T$ is supplied to a first linear amplifier circuit V1 and to a second linear amplifier circuit V2 for the purpose of tuning the preliminary circuit VK and the intermediate circuit ZK.

In this case, the tuning voltage $V_{TVK}$ for the preliminary circuit is produced on the basis of the following equation:

$$V_{TVK} = Y1 \cdot V_T + X1$$

The tuning voltage $V_{TZK}$ for the intermediate circuit is calculated as follows:

$$V_{TZK} = Y2 \cdot V_T + X2$$

The multiplication coefficient Y and the addition coefficient X are determined and stored once, during manufacture or when turning on the receiver, as a result of a maximum adjustment of the output voltage of the mixer.

Figure 3:
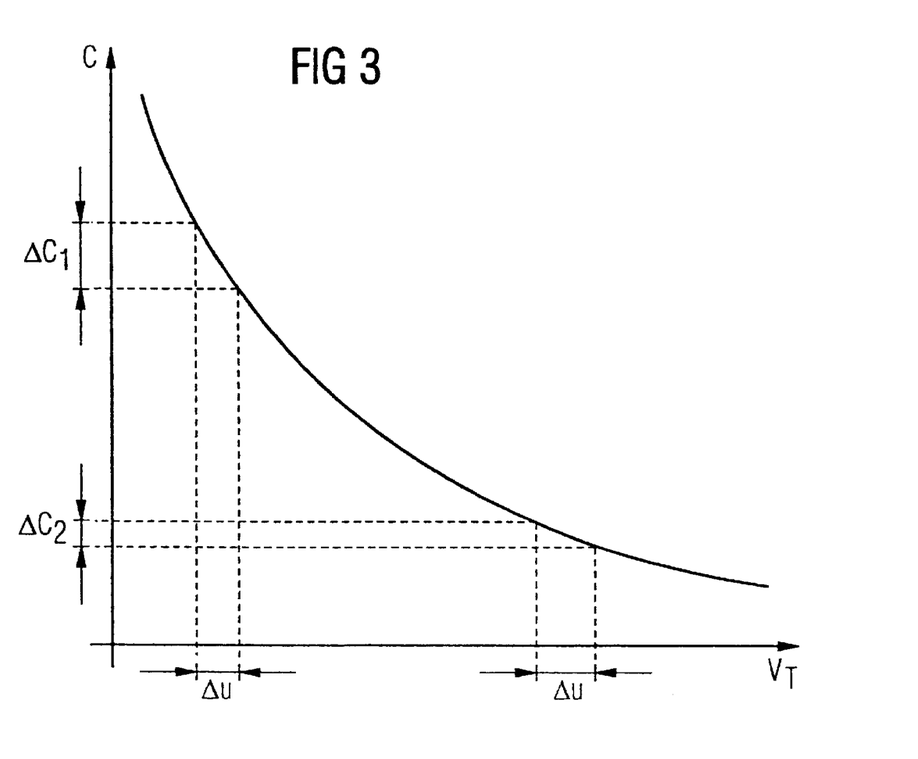
FIG. 3 is a graph illustrating the capacitance curve for a variable-capacitance diode as a function of the tuning voltage.

FIG. 3 shows the capacitance curve for a variable-capacitance diode in a tunable resonant circuit as a function of the applied tuning voltage $V_T$. The variable-capacitance diode or variable-capacitance varactor diode is a reverse-biased semiconductor diode having a hyperabrupt pn-junction or a metal-semiconductor junction, wherein the voltage dependency of the depletion-layer capacitance is utilized. As can be seen from FIG. 3, the capacitance of the varactor diode decreases nonlinearly as the tuning voltage increases. The variable-capacitance varactor diode is more sensitive at a low tuning voltage $V_T$ than at a high tuning voltage. With a voltage change $\Delta U$, the change in capacitance $\Delta C_1$ is larger than the capacitance change $\Delta C_2$ at a higher tuning voltage.

In conventional setting apparatuses, the tuning voltage for the preliminary circuit VK, for example, is linearly dependent on the tuning voltage $V_T$.

Figure 4:
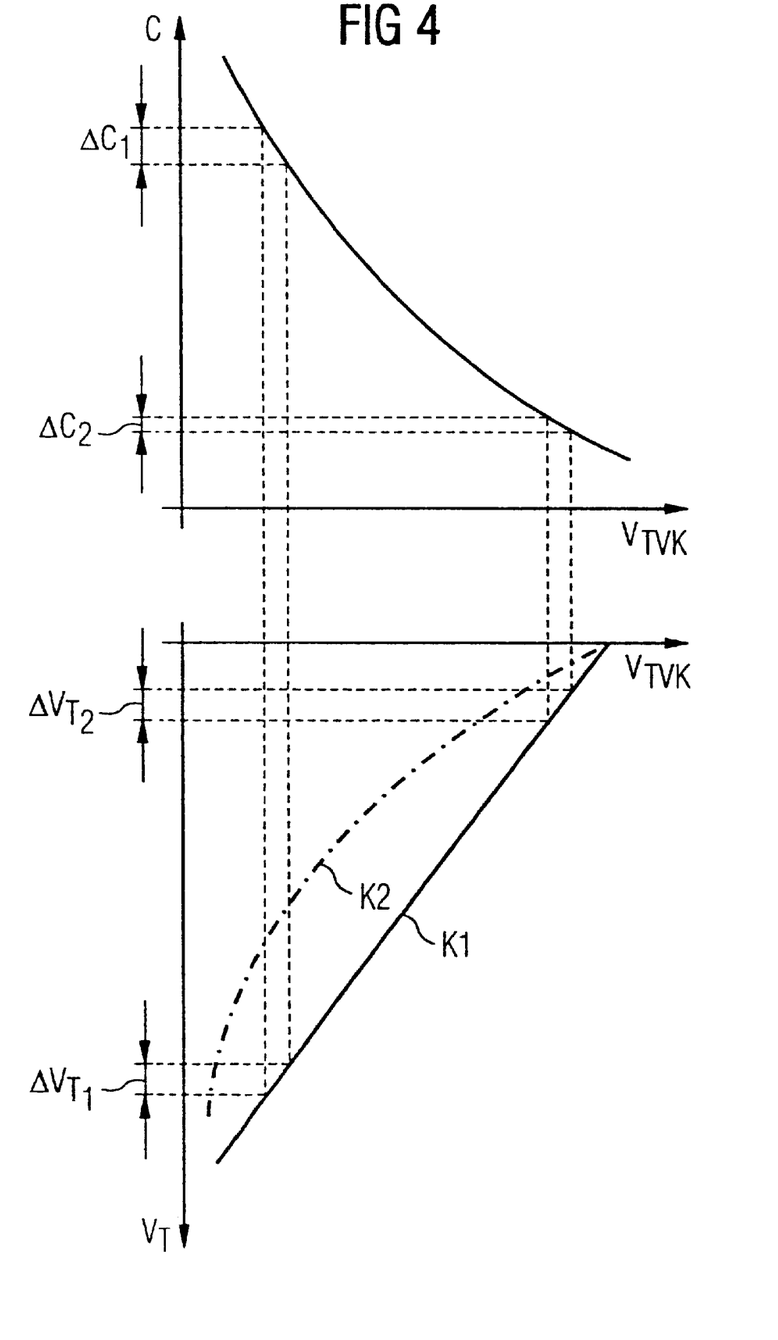
FIG. 4 is a graph Illustrating the change in the tuning capacitances of resonant circuits for a linear tuning gain curve, to explain the object of the invention.

FIG. 4 shows the dependency of the capacitance of the varactor diode on the oscillator tuning voltage $V_T$. As can be seen from the bottom graph in FIG. 4, the tuning voltage $V_{TVK}$, produced by the amplifier setting device V1, for the preliminary circuit VK falls linearly as the tuning voltage $V_T$ increases, so that a voltage change $\Delta V_{T1}$ results in a capacitance change $\Delta C_1$, and a voltage change $\Delta V_{T2}$ results in a capacitance change $\Delta C_2$. If the voltage change $\Delta V_{T2}$ is the same as the voltage change $\Delta V_{T1}$, FIG. 4 shows that the capacitance change $\Delta C_1$ at a high tuning voltage $V_T$ is significantly larger than the capacitance change $\Delta C_2$ at a low tuning voltage $V_T$. Since the tuning voltage $V_T$ is set digitally by the microprocessor $\mu P$, the smallest voltage change $\Delta V_T$ is equivalent to one bit. As FIG. 4 shows, the change in the microprocessor's control signal by the smallest unit, i.e. by one bit, produces different capacitance changes, and hence frequency changes, in the tuning circuits, depending on what point is taken on the linear amplifier curve. In the linear tuning method shown in FIG. 4, the nonlinear capacitance curve for the varactor diode results in falsifications, distortions or corruptions, because the signal resolutions of the control signal are constant over the whole amplification range.

The nonlinearity of the tuning component within the tunable resonant circuit therefore produces corruptions when tuning the resonant circuits, which impairs synchronism.

This problem exists in all resonant circuits adjusted by a tuning component whose setting variable has a nonlinear curve.

SUMMARY OF THE INVENTION

It is accordingly an object of the invention to provide a setting apparatus and a setting method for setting tunable resonant circuits which overcome the above-mentioned disadvantages of the heretofore-known apparatusses and methods of this general type and which compensate for nonlinearities in the tuning component.

With the foregoing and other objects in view there is provided, in accordance with the invention, in combination with a tunable resonant circuit connected to a phase locked loop, a setting apparatus for setting a tuning voltage for the tunable resonant circuit. The setting apparatus includes:

an amplification device receiving a digital gain control signal for setting a gain, the amplification device having a signal resolution differing as a function of the gain;

the amplification device generating the tuning voltage by nonlinearly amplifying an oscillator tuning voltage being output by the phase locked loop;

the amplification device having a first digital/analog converter and a second digital/analog converter, the first and second digital/analog converters respectively having an input for receiving analog voltages and respectively being controllable by a digital control signal;

the input of the first digital/analog converter being supplied with an analog voltage in dependence of the oscillator tuning voltage; and the input of the second digital/analog converter being supplied with a further analog voltage provided by a constant signal.

In other words, the setting apparatus according to the invention is provided with an amplifier device which amplifies an oscillator tuning voltage, output by a phase locked loop, nonlinearly to produce a tuning voltage, in which case the gain can be set by a digital gain control signal and the signal resolution increases as the gain decreases.

In accordance with another feature of the invention, the amplification device is configured such that, as a function of the digital gain control signal, the signal resolution increases as the gain decreases.

In a further advantageous embodiment of the setting apparatus according to the invention, an offset apparatus is provided which amplifies a reference voltage linearly to produce an offset voltage.

In one advantageous embodiment of the setting apparatus according to the invention, the tuning voltage can be displaced or shifted by the offset voltage.

In a further advantageous embodiment of the setting apparatus according to the invention, a summation device is provided which sums the offset voltage and the tuning voltage to produce a tuning summed voltage, which is used to tune the tunable resonant circuit.

In a further advantageous embodiment of the setting apparatus according to the invention, the digital cain control signal and the digital offset control signal are produced by a microprocessor.

In a further advantageous embodiment of the setting apparatus according to the invention, the microprocessor receives a measurement signal from a signal measuring device.

In a further advantageous embodiment of the setting apparatus according to the invention, the signal measuring device records an output signal amplitude of a mixer connected downstream of the tunable resonant circuits.

In a further advantageous embodiment of the setting apparatus according to the invention, the microprocessor sets the digital gain control signal and the digital offset control signal such that the amplitude of the output signal from the mixer attains a maximum.

In a further advantageous embodiment of the setting apparatus according to the invention, the oscillator tuning voltage is converted by a voltage/current converter into a tuning current which is amplified by a current amplification device.

In a further advantageous embodiment of the setting apparatus according to the invention, the reference voltage is converted by a voltage/current converter into a constant current which is amplified by a current amplification device.

In a further advantageous embodiment of the setting apparatus according to the invention, the amplified tuning current and the amplified constant current are summed at a summed current node to produce a summed current.

In a further advantageous embodiment of the setting apparatus according to the invention, the summed current is converted by a current/voltage converter to produce the tuning summed voltage.

In a further advantageous embodiment of the setting apparatus according to the invention, the tuning voltage sets the capacitance of a variable-capacitance varactor diode in the tunable resonant circuit.

A tuning method for tuning circuits has the following steps, specifically an oscillator tuning voltage is produced by a phase locked loop, the oscillator tuning voltage is amplified by an amplifier device with nonlinear gain, the tuning circuits are tuned using the amplified oscillator tuning voltage, the output signal from the tuning circuit is mixed with an oscillator mixed frequency signal, the output signal amplitude of the mixed signal produced by the mixer is measured, the gain is varied by a control device until the measured output signal amplitude attains a maximum.

Other features which are considered as characteristic for the invention are set forth in the appended claims.

Although the invention is illustrated and described herein as embodied in an apparatus for setting the tuning voltage of tunable resonant circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE PREFERRED EMBODIMENTS

Figure 5:
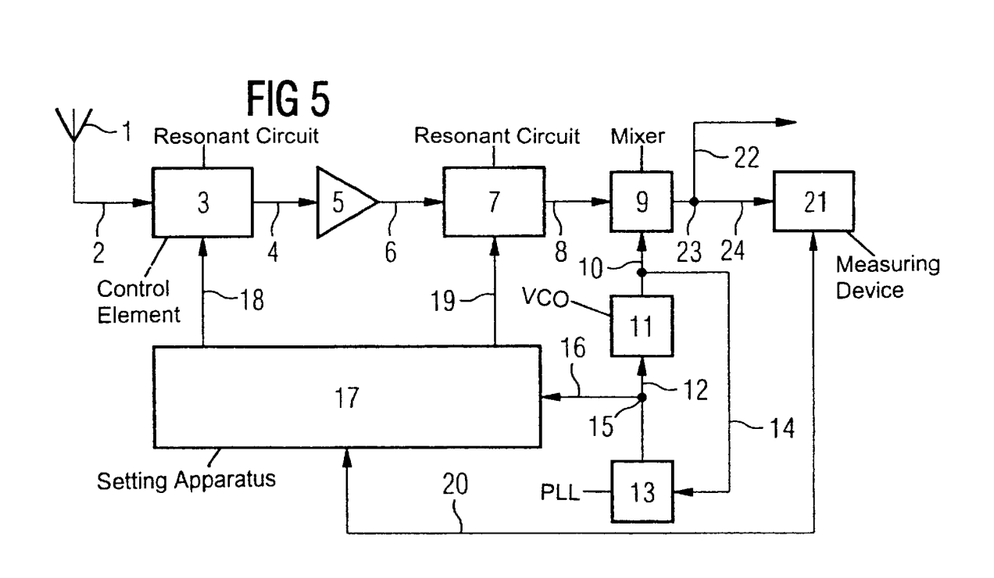
FIG. 5 is a block diagram of a receiver having a setting apparatus in accordance with the invention.

Referring now to the figures of the drawings in detail and first, particularly, to FIG. 5 thereof, there is shown a signal receiver containing the setting apparatus for setting the tuning voltage for the tunable resonant circuits.

The signal receiver has an antenna 1 which supplies a radiofrequency input signal to a first resonant circuit 3 via a radiofrequency line 2. The first resonant circuit 3 is the so-called preliminary circuit, which filters the received signal according to the desired reception frequency. The preliminary circuit 3 is connected via a line 4 to an amplifier 5 which amplifies the filtered signal and outputs it to a further resonant circuit 7 via a line 6. The resonant circuit 7 is the so-called intermediate circuit, which filters the received input signal further according to the desired reception frequency and outputs it to a mixer 9 via a line 8. The mixer 9 mixes the signal which is on the line 8 with an oscillator mixed signal, which is output by a voltage-controlled oscillator 11 via a line 10. The voltage-controlled oscillator 11 receives, via a line 12, an oscillator tuning voltage $V_T$ which is produced by a phase locked loop 13. For this purpose, the phase locked loop is supplied, via a feedback line 14, with the oscillator signal produced by the voltage-controlled oscillator 11. The oscillator tuning voltage $V_T$ produced by the phase locked loop 13 is branched off at a node 15 and is supplied, via a line 16, to a setting apparatus 17 for setting the tuning voltages of the two tunable resonant circuits 3, 7. The setting apparatus 17 is connected to the preliminary circuit 3 via a first tuning line 18 and to the intermediate circuit 7 via a second tuning line 19. The setting apparatus 17 receives, via a measurement signal reception line 20, a measurement signal from a measuring device 21, which is a digital voltmeter, for example. The mixer 9 mixes the signals which are on the lines 8 and 10 by multiplying them. The output mixed signal from the mixer 9 is output For further signal processing via a line 22. The mixed signal is tapped off at a measurement point 23 and is supplied to the measuring device 21 via a measurement line 24. The measuring device measures the field strength or the signal amplitude of the output mixed signal from the mixer 9. The recorded amplitude is supplied to the setting apparatus 17 via the line 20.

Figure 6:
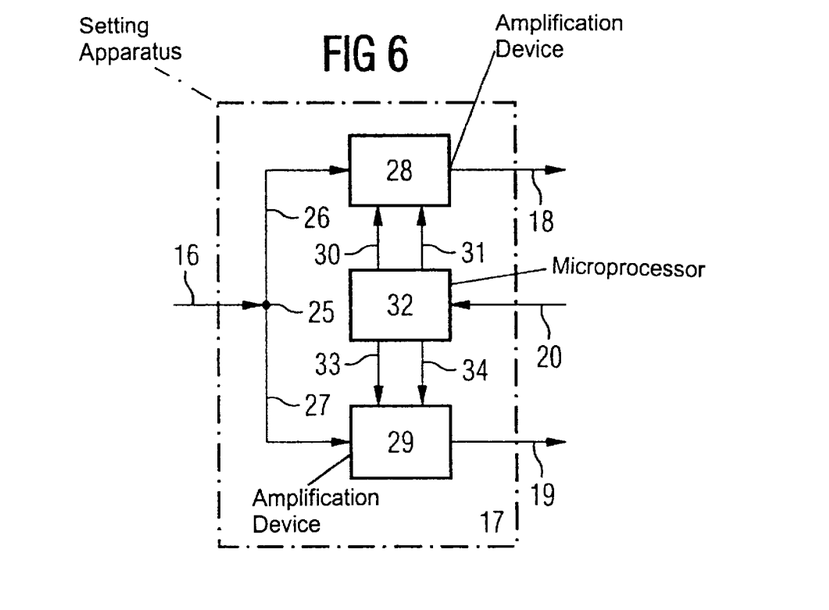
FIG. 6 is a block diagram of a setting apparatus for setting the tuning voltage for two tunable resonant circuits in accordance with the invention.

FIG. 6 shows the configuration of the setting apparatus 17 (shown in FIG. 5) for setting the two tunable resonant circuits 3, 7. The setting apparatus receives the oscillator tuning voltage $V_T$, which is produced by the phase locked loop 13, via the line 16. The line 16 branches into a line 26 and a line 27 at the junction point 25 inside the setting apparatus. The setting apparatus 17 contains a first digitally controllable amplification device 28 for amplifying the oscillator tuning voltage which is on the line 26, and a second digitally controllable amplification device 29 for amplifying the oscillator tuning voltage which is on the line 27. The first digitally controllable amplification device 28 is controlled by a microprocessor 32 via digital control lines 30, 31. In addition, the microprocessor 32 controls the second digitally controllable amplification device 29 via digital control lines 33, 34. The first amplification device 28 outputs a tuning control signal to the first tunable resonant circuit 3 via the tuning control line 18. The second amplification device 29 outputs a tuning control signal to the second tunable resonant circuit 7 via the tuning control line 19. The digital control signals which are on the lines 30, 31, 33, 34 are produced by the microprocessor 32 in dependence of the measurement signal which is on the line 20. The internal configuration of the two amplification devices 28, 29 is largely identical and is described below with reference to FIG. 7.

Figure 7:
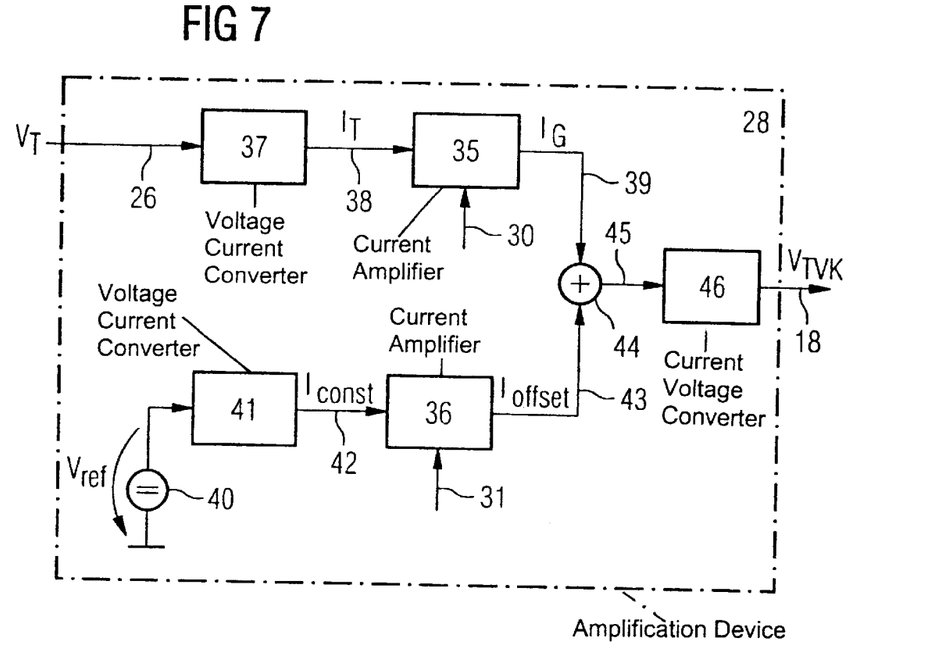
FIG. 7 is a schematic block diagram of a setting apparatus for setting the tuning voltage of a tunable resonant circuit in accordance with the invention.

FIG. 7 shows the configuration of the amplification device 28 shown in FIG. 6. The first digital control line 30 controls a digitally controllable current amplifier 35. The control line 31 controls a further digitally controllable current amplifier 36. The oscillator tuning voltage $V_T$ which is on the line 26 is converted by a voltage/current converter 37 into a tuning current which is supplied to the current amplifier 35 via a line 38. The current amplifier 35 amplifies the current supplied via the line 38 by a digitally settable gain factor G and outputs the amplified current via a line 39.

The constant voltage produced by a reference voltage source 40 is converted by a voltage/current converter 41 into a constant current which is supplied to the current amplification device 36 via a line 42. The amplification device 36 amplifies the constant current which is on the line 42 linearly on the basis of the digital control signal received on the line 31, and outputs it via a line 43. The amplified currents which are on the lines 39, 43 are summed at a summation node 44 and are supplied to a current/voltage converter 46 via a line 45. The current/voltage converter 46 converts the received summed current into a tuning control voltage for the preliminary circuit 3.

The current amplification device 36 produces a constant offset current, which is summed with the amplified tuning current at the summation point 44.

Figure 8:
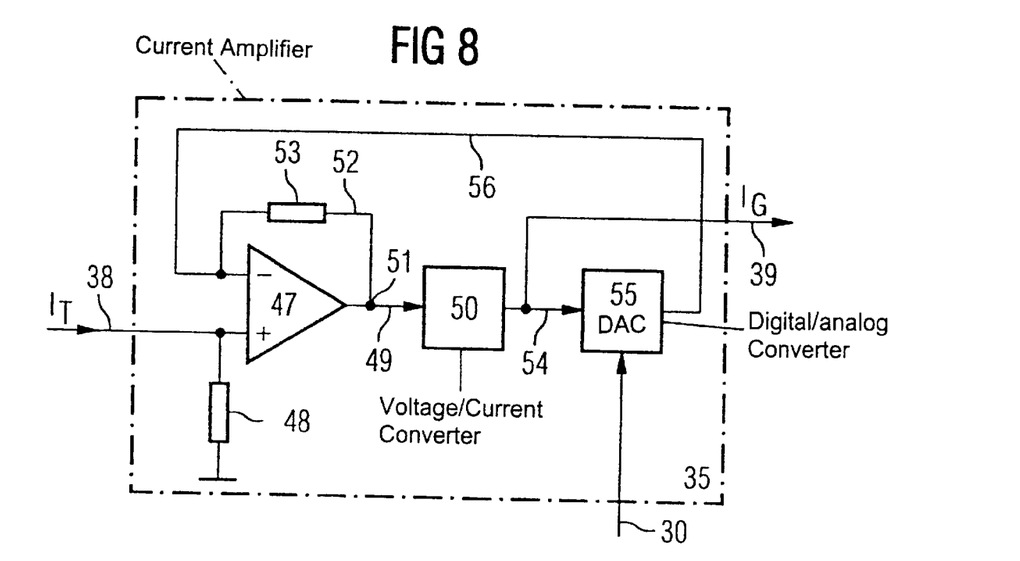
FIG. 8 is a schematic block diagram of an amplification device in accordance with the invention.

FIG. 8 is a detailed view of the current amplifier 35 shown in FIG. 7. The tuning current $I_T$ is supplied to the noninverting input of an operational amplifier 47 via the line 38, with a voltage drop appearing across a resistor 48. The operational amplifier 47 is connected to a voltage/current converter 50 via a line 49. The output line 49 of the operational amplifier 47 is branched off at a junction point 51, and the output of the operational amplifier is fed back to the inverting input of the operational amplifier 47 via a feedback line 52 in which a resistor 53 is provided. The output of the voltage/current converter 50 is connected to a digital/analog converter DAC 55 via a line 54. The digital/analog converter 55 is a 7-bit DAC, for example, which converts a 7-bit control signal supplied via the digital control line 30 into an analog signal. The converted voltage is applied to the inverting input of the operational amplifier 47 via a line 56.

Figure 9:
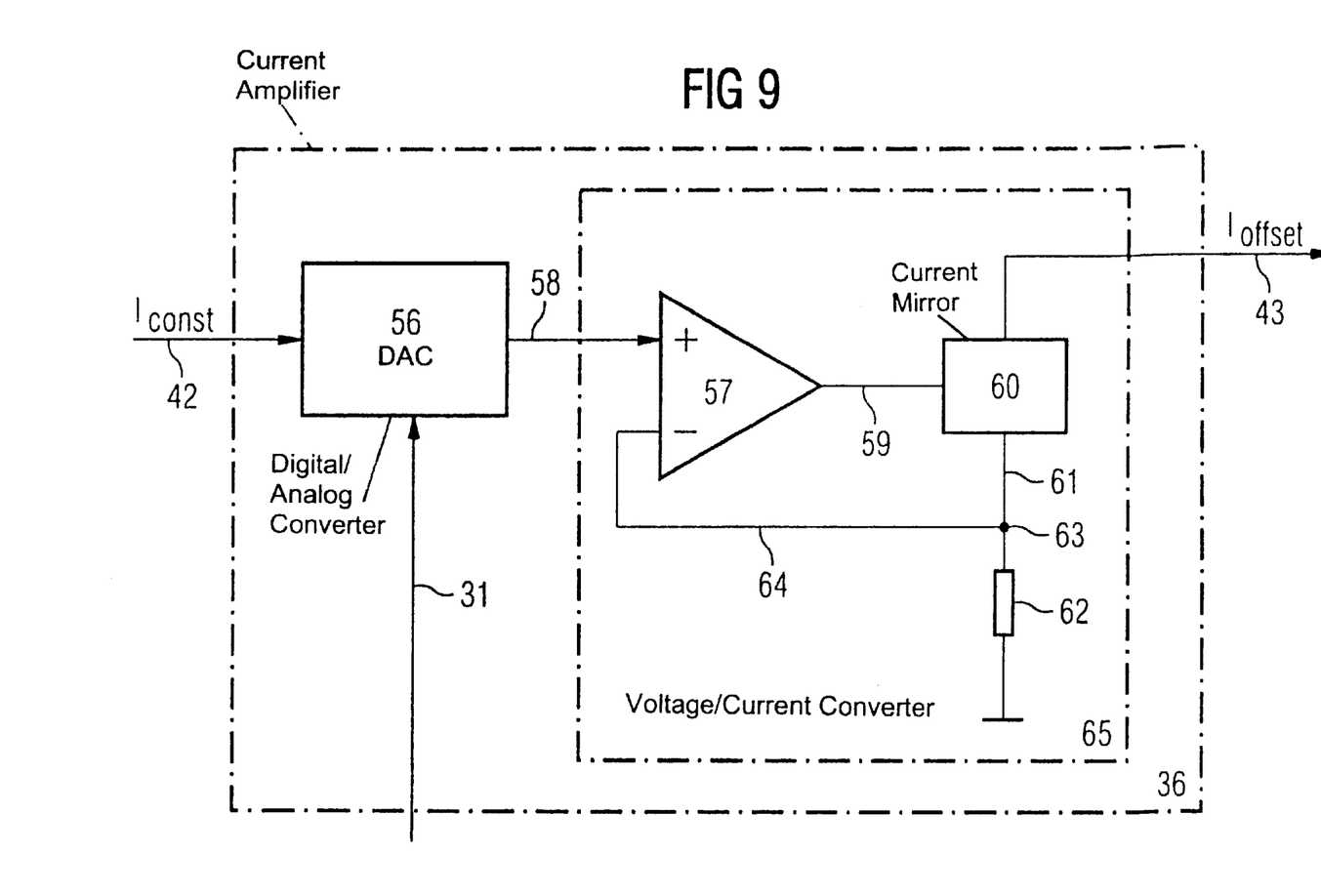
FIG. 9 is a schematic block diagram of an offset device in accordance with the invention.

FIG. 9 is a detailed view of the second amplifier 36, shown in FIG. 7. The digitally controllable amplifier 36 is controlled by the microprocessor 32 shown in FIG. 6 via the digital control line 31. The digital control signal from the microprocessor 32 is supplied to a digital/analog converter DAC 56. The digital/analog converter DAC 56 is, by way of example, also a 7-bit DAC for converting a 7-bit control signal. The input of the digital/analog converter 56 is connected via the line 42 to the voltage/current converter 41 shown in FIG. 7. The output of the digital/analog converter 56 is supplied to the noninverting input of an operational amplifier 57 via a line 58. The output of the operational amplifier 57 is connected to a current-mirror circuit 60 via a current line 59. The current-mirror circuit 60 is grounded via a line 61 and a resistor 62. The line 61 Is branched off at a junction point 63, and the voltage across the resistor 62 is fed back to the inverting input of the operational amplifier 57 via a feedback line 64. The current-mirror circuit 60 outputs, via the line 43, an offset current to the summation point 44 shown in FIG. 7. The operational amplifier 57 and the current mirror 60 form, together with the resistor 62, a voltage/current converter 65.

Figure 10:
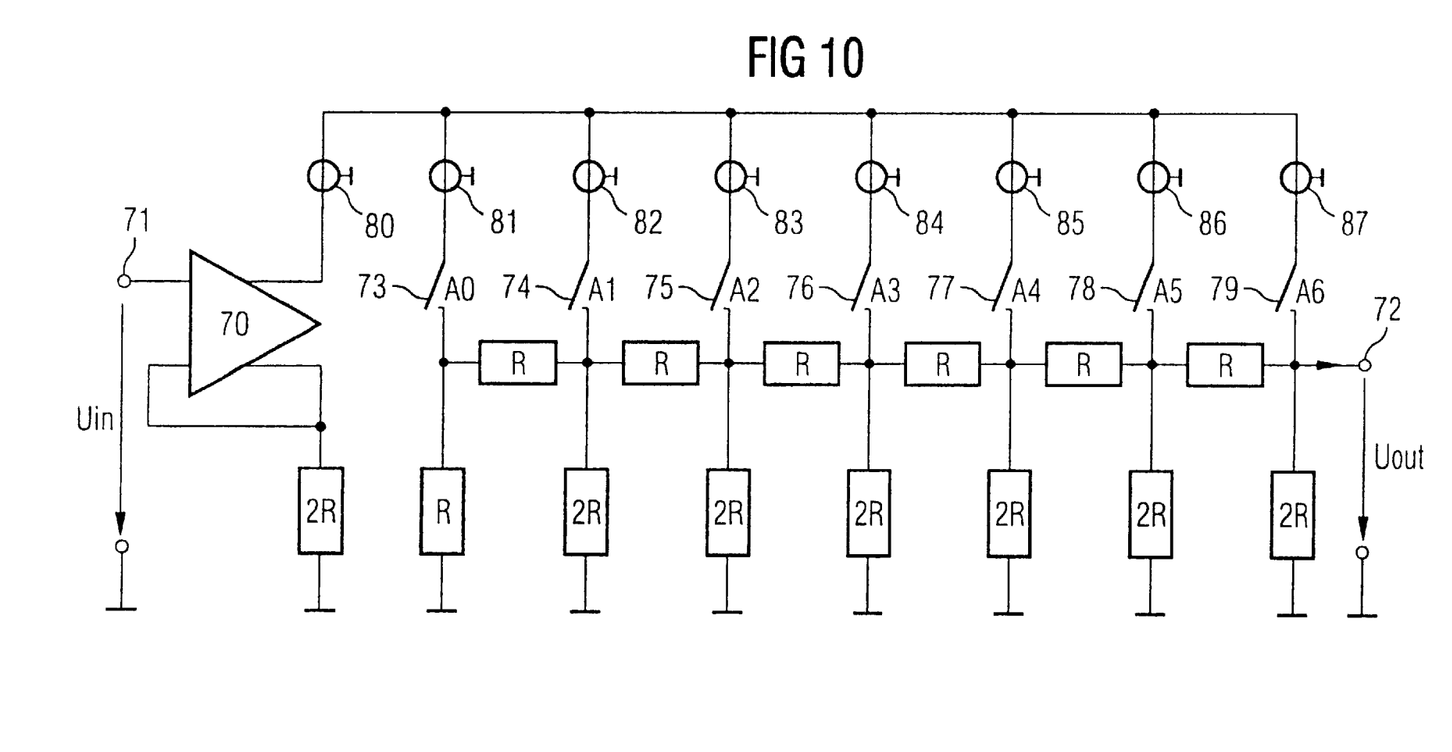
FIG. 10 is a schematic block diagram of an embodiment of a 7-bit digital/analog converter, which is provided in the amplification device and in the offset device in accordance with the invention.

FIG. 10 shows a 7-bit digital/analog converter, as shown in the form of DAC 55 in FIG. 8 and DAC 56 in FIG. 9. The 7-bit digital/analog converter in FIG. 10 contains an operational amplifier 70. The digital/analog converter has an analog voltage input 71 and an analog voltage output 72. Inside, the digital/analog converter contains seven internal switching components 73, 74, 75, 76, 77, 78, 79, which can connect current sources 80, 81, 82, 83, 84, 85, 86, 87 to a resistor network having the resistance values R shown. The internal switches 73–79 shown are, by way of example, driven by one of the 7-bit control lines 30–34 in FIG. 6.

The analog output voltage which is on the output connection 72 is amplified with respect to the analog input voltage applied to the input connection 71 on the basis of the following formula:

$$U_{AUS} = \frac{U_{IN}(A0 + 2A1 + 4A2 + 8A3 + 16A4 + 32A5 + 64A6)}{128}$$

The current amplification device 35 in FIG. 7 is shown in detail in FIG. 8. A preferred embodiment of the current amplification device 35 contains the 7-bit DAC, shown in FIG. 10, as a digital/analog converter 55. Accordingly, a gain G which is used to amplify the tuning current $I_T$ on line 38 to produce the amplified current $I_G$ on line 39 is given as:

$$G = \frac{I_G}{I_1} = \frac{128}{(64+n)},$$

where n=0 . . . 127.

The offset current amplifier 36 shown in FIG. 7 is shown in detail in FIG. 9. In accordance with one preferred embodiment, the digital/analog converter 56 in the offset current amplifier 36 is a 7-bit digital/analog converter as shown in FIG. 10. Accordingly, the current gain of the offset current amplifier 36 is given as:

$$\text{Offset current gain} = \frac{I_{OFFSET}}{I_{CONSTANT}} = \frac{n}{127},$$

where n=0 . . . 127.

The tuning voltage $V_{TVK}$ for the tunable resonant circuit 3 shown in FIG. 5 is, as can be seen from FIG. 7, dependent on the oscillator tuning voltage $V_T$, present on the line, and on an offset voltage. If it is assumed that the voltage/current converters 37, 41 have a gain of 1 and that the current/voltage converter 46 also has a gain of 1, the tuning voltage for the tunable resonant circuit 3 or preliminary circuit 3 is given as:

$$V_{TVK} = V_T \cdot G + V_{OFFSET},$$

where $$G = \frac{128}{64+n} \text{ and } V_{OFFSET} = V_{REF} \cdot \frac{n}{127}.$$

Figure 11:
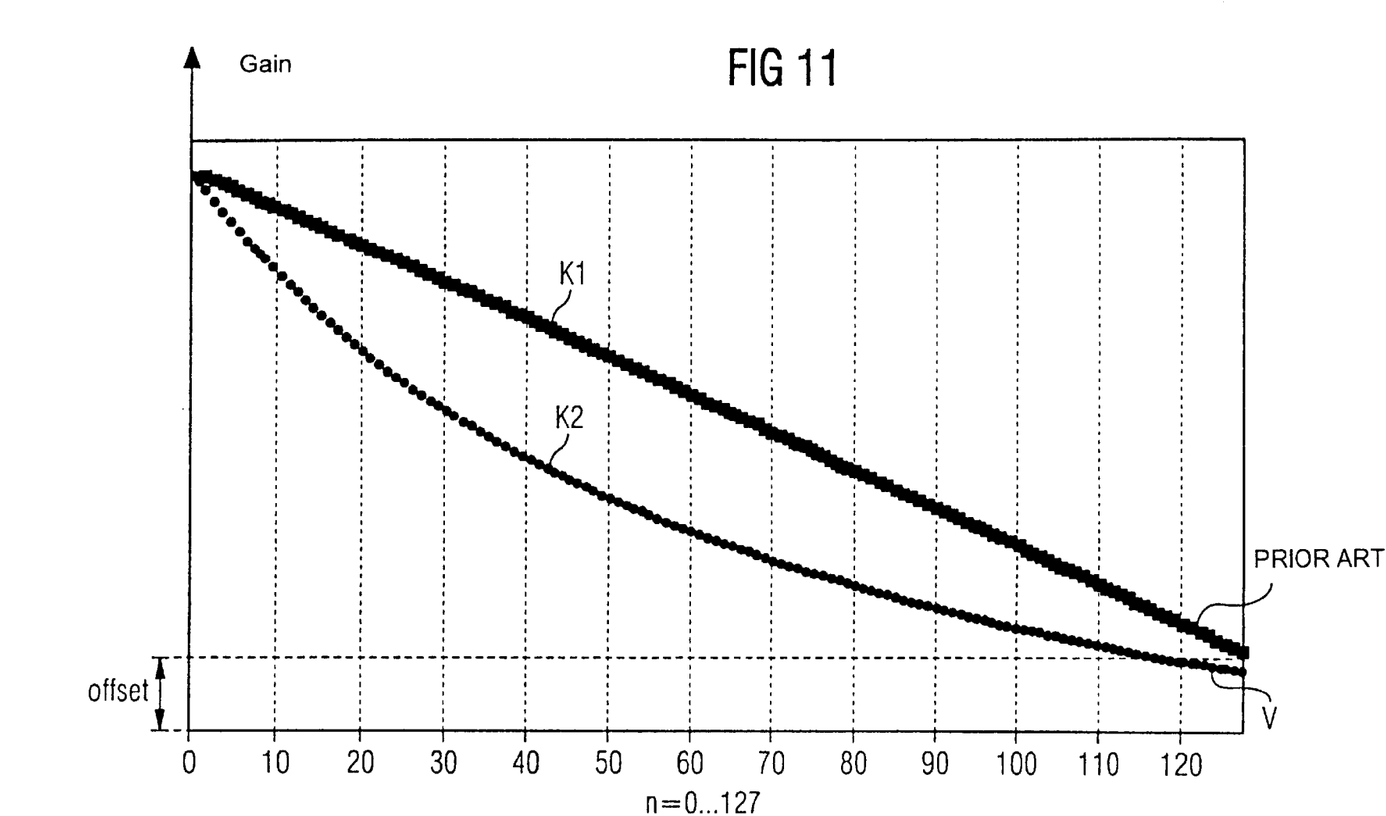
FIG. 11 is a graph illustrating the curve for the gain in the amplification device in accordance with the invention, as compared with a linear gain curve based on the prior art.

FIG. 11 shows a typical gain curve for a setting apparatus 28, 29 for setting the tuning voltage of a tuning circuit 3, 7 in accordance with the invention, as compared with a conventional linear gain curve based on the prior art. The gain is shown as a function of a 7-bit digital control signal from the microprocessor 32. The 7-bit control signal can assume 128 discrete digital values. With a digital control signal of 0, the gain is at a maximum and decreases linearly for a conventional setting apparatus based on the prior art, as used in the receiver circuit in FIG. 1. This is shown by the falling linear staircase curve K1 in FIG. 11. By contrast, the gain of the setting apparatus in accordance with the invention decreases nonlinearly as the digital control value increases, as shown by curve K2 in FIG. 11. As can be seen from FIG. 11, the signal resolution increases as the absolute gain decreases in the case of curve K2, corresponding to the gain curve for the setting apparatus according to the invention. As the digital control value increases, the gain change becomes smaller For each digital step. As an example, the gain change when the digital control value is increased from 10 to 11 is larger than when the digital control value is increased from 120 to 121. In other words, the signal resolution becomes better and better as the gain V decreases.

As can be seen from FIG. 4, the variable-capacitance diode is more sensitive at low voltage $V_{TVK}$ than at high tuning voltages $V_{TVK}$. On account of the negatively decreasing gain, a high resonant circuit tuning voltage $V_{TVK}$ for the preliminary circuit 3 is equivalent to a low oscillator tuning voltage $V_T$ produced by the phase locked loop, and vice versa, as can be seen from FIG. 4. The resolution of the gain in FIG. 11 therefore increases in the sensitive range of the variable-capacitance diode as the digital control value increases, as can be seen from curve K2. Conversely, the resolution in the relatively insensitive range of the variable-capacitance diode decreases as the digital control value falls and the gain rises.

The gain curve for the setting apparatus according to the invention for setting the tuning voltage thus compensates for the relative insensitivity of the variable-capacitance diode (FIG. 4 $\Delta C_2$) through the use of a larger gain step for each step of the digital control signal. Conversely, the setting apparatus according to the invention compensates for the high sensitivity of the variable-capacitance diode (FIG. 4 $\Delta C_1$) through the use of smaller gain change steps for each change step of the digital control signal. Thus, taking a gain range in which the variable-capacitance diode is sensitive, the analog gain changes are reduced for each digital value change, while in gain ranges in which the variable-capacitance diode is relatively insensitive, the gain changes are increased for each change step of the digital control signal. The gain characteristic curve K2 according to the invention shown in FIG. 11 thus compensates for the non-linear capacitive dependency of a typical tuning varactor diode used for tuning a tunable resonant circuit. As a result of this, the frequency change steps of the tuning circuits are approximately the same over the entire control signal value, so that corruptions or falsifications on account of the non-linear characteristic curve of the variable-capacitance diode are prevented.

Figure 12:
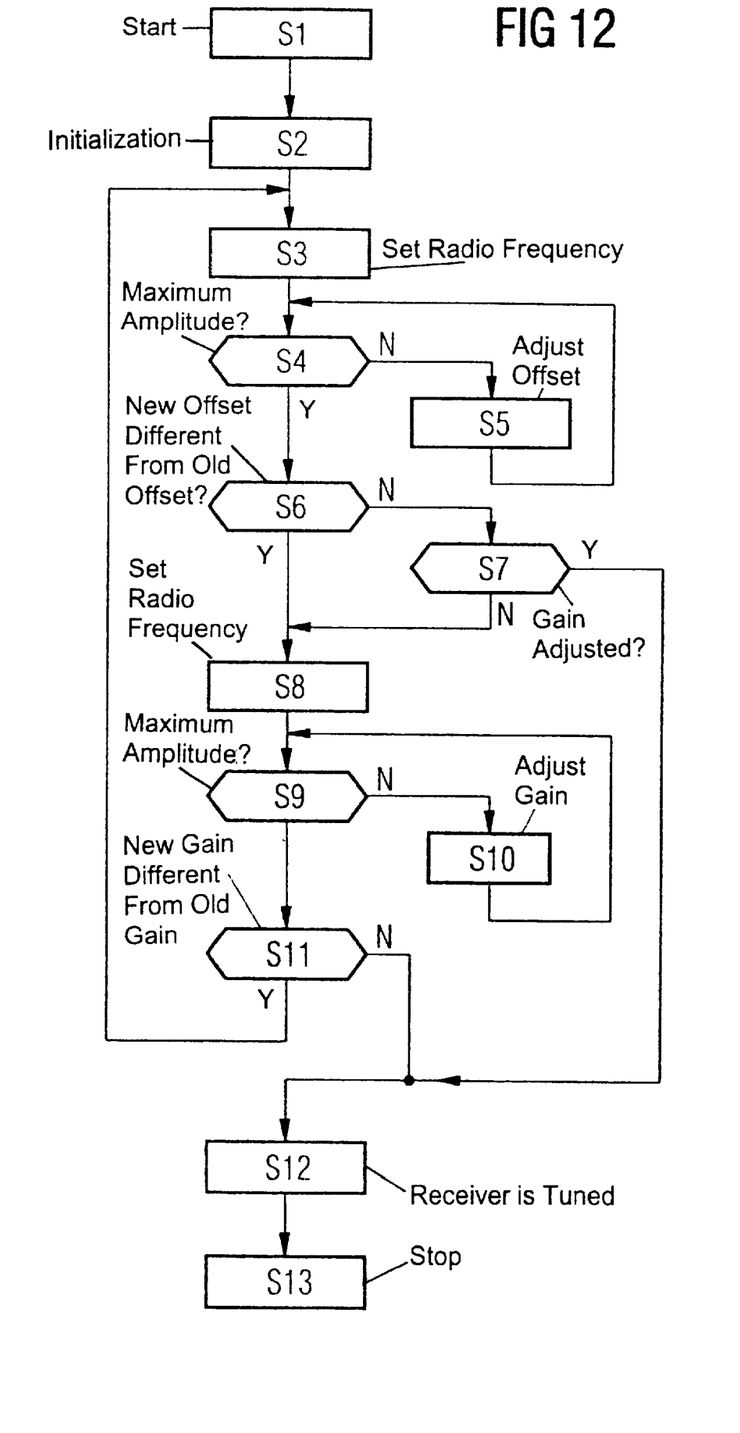
FIG. 12 is a flow chart for the tuning method according to the invention.

FIG. 12 shows a flow chart of a tuning method using an apparatus according to the invention. The tuning method starts with the starting step S1, which is followed by an initialization step S2. In the initialization step S2, the offset voltage is set to 0 and the gain is set to 1. In a step S3, the antenna input of the receiver is set to a particular radio frequency, for example 87.5 MHz. At the same time, the tuning frequency $f_{VCO}$ is set to a frequency which is increased by the intermediate frequency, for example 98.2 MHz, given an intermediate frequency of 10.7 MHz. In step S4, a measurement is carried out to determine whether or not the amplitude measured by the measuring device 21 is at a maximum. If the amplitude is not at a maximum, the offset voltage is adjusted in the setting apparatus 17 in a step S5 until the measured amplitude attains a maximum. After the signal amplitude of the output signal from the mixer 9 has been established to be at a maximum in step S4, a check is carried out in step S6 to determine whether the offset value which has now been set differs from the previous offset value. If the offset value does not differ, a check is carried out in step S7 to determine whether the gain has already been adjusted. If the gain G has not yet been adjusted, the radiofrequency input signal is set to a further frequency or discrete point, for example 108 MHz, in a step S8. The PLL 13 is set to 118.7 MHz in step S8, accordingly increased by the intermediate frequency of 10.7 MHz. Step S8 is also carried out if step 6 establishes that the offset value found matches the previous offset value. After step S8, a measurement Is carried out in step S9 to determine whether the signal amplitude of the output signal from the mixer 9 is at a maximum. If not, the gain is adjusted in step S10 until the amplitude of the output signal from the mixer 9 attains a maximum. After step S9 establishes that the signal output amplitude of the mixer 9 is at a maximum or has attained a maximum, a check is carried out in step Sil to determine whether the gain value G which has been found or has now been set differs from the previous gain value G. If there is a difference, the process branches back to step S3. If there is no difference, step S12 establishes that the receiver is now optimally tuned. If S7 establishes that the gain has already been adjusted, then the process moves directly to step S12, i.e. optimum tuning of the receiver and the system can be established directly. After step S12, the tuning method is ended in the stop step S13.

The setting apparatus according to the invention can be incorporated, with the resonant circuits to be tuned, in an integrated circuit. The setting apparatus according to the invention is not only suitable for tuning tunable resonant circuits in radio receivers, but also for any desired resonant circuits whose setting element has a nonlinear characteristic. The nonlinear gain curve for the setting apparatus according to the invention compensates for the nonlinear characteristic of the control element or actuator for the tuning circuit, with the signal resolution increasing in the sensitive ranges of the nonlinear actuator for the tuning circuit.

The setting apparatus according to the invention can be used for setting one or more tunable resonant circuits.

We claim:

1. In combination with a tunable resonant circuit connected to a phase locked loop, a setting apparatus for setting a tuning voltage for the tunable resonant circuit, comprising:

an amplification device receiving a digital gain control signal for setting a gain, said amplification device having a signal resolution differing as a function of the gain;

said amplification device generating the tuning voltage by nonlinearly amplifying an oscillator tuning voltage being output by the phase locked loop;

said amplification device having a first digital/analog converter and a second digital/analog converter, said first and second digital/analog converters respectively having an input for receiving analog voltages and respectively being controllable by a digital control signal;

said input of said first digital/analog converter being supplied with an analog voltage in dependence of the oscillator tuning voltage; and said input of said second digital/analog converter being supplied with a further analog voltage provided by a constant signal.

2. The setting apparatus according to claim 1, wherein said amplification device is configured such that, as a function of the digital gain control signal, the signal resolution increases as the gain decreases.

3. The setting apparatus according to claim 2, wherein said amplification device includes an offset device, said offset device contains said second digital/analog converter and amplifies a reference voltage linearly for producing an offset voltage, the reference voltage being derived from the constant signal.

4. The setting apparatus according to claim 3, wherein said amplification device is configured such that the tuning voltage is displaceable by the offset voltage.

5. The setting apparatus according to claim 3, wherein said offset device is controllable by a digital offset control signal.

6. The setting apparatus according to claim 1, wherein said amplification device includes a voltage/current converter for converting the oscillator tuning voltage into a tuning current and a current amplification device containing the first digital/analog converter and amplifying the tuning current.

7. The setting apparatus according to claim 1, wherein said offset device includes a voltage/current converter and a current amplification device, said voltage/current converter converts a reference voltage, derived from the constant signal, into a constant current, said current amplification device amplifies the constant current for providing an amplified constant current.

8. The setting apparatus according to claim 7, wherein said amplification device includes:

- a further voltage/current converter for converting the oscillator tuning voltage into a tuning current;
- a further current amplification device, connected to said further voltage/current converter, containing the first digital/analog converter, and amplifying the tuning current for providing an amplified tuning current; and
- a summed current node connected to said further current amplification device for summing the amplified tuning current and the amplified constant current and producing a summed current.

9. The setting apparatus according to claim 8, wherein said amplification device includes a current/voltage converter for converting the summed current and producing a tuning summed voltage as the tuning voltage.

10. The setting apparatus according to claim 1, wherein the tunable resonant circuit includes a control element having a nonlinear characteristic, said amplification device controls the control element with the tuning voltage.

11. The setting apparatus according to claim 10, wherein the control element is a variable-capacitance varactor diode, said amplification device controls the variable-capacitance varactor diode with the tuning voltage.

* * * * *